United States Patent
Tiziani et al.

(10) Patent No.: US 9,971,536 B2
(45) Date of Patent: *May 15, 2018

(54) CONTROLLER TO MANAGE NAND MEMORIES

(71) Applicant: Micron Technology, Inc., Boise, ID (US)

(72) Inventors: Federico Tiziani, Munich (DE); Giovanni Campardo, Bergamo (BG); Massimo Iaculo, San Marco Evangelista (IT); Claudio Giaccio, Torre del Greco (IT); Manuela Scognamiglio, Burago Molgora (IT); Danilo Caraccio, Buonalbergo (IT); Ornella Vitale, Cicciano (IT); Antonino Pollio, Vico Equense (IT)

(73) Assignee: Micron Technology, Inc., Boise, ID (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/431,457

(22) Filed: Feb. 13, 2017

(65) Prior Publication Data

US 2017/0160973 A1    Jun. 8, 2017

Related U.S. Application Data

(63) Continuation of application No. 14/967,934, filed on Dec. 14, 2015, now Pat. No. 9,569,129, which is a
(Continued)

(51) Int. Cl.
*G06F 11/00* (2006.01)
*G06F 3/06* (2006.01)
(Continued)

(52) U.S. Cl.
CPC .......... *G06F 3/0625* (2013.01); *G06F 1/3275* (2013.01); *G06F 3/0634* (2013.01);
(Continued)

(58) Field of Classification Search
CPC .... G06F 3/0625; G06F 1/3275; G06F 3/0634; G06F 3/0659; G06F 11/10; G06F 11/1044
See application file for complete search history.

(56) References Cited

U.S. PATENT DOCUMENTS 5,918,242 A     6/1999 Sarma et al.
6,266,724 B1 *  7/2001 Harari .................. G06F 13/4068
                                                    710/13
(Continued)

FOREIGN PATENT DOCUMENTS

CN    ZL200880131514.3    5/2017
DE       112008004033 T5    1/2012
(Continued)

OTHER PUBLICATIONS

"Chinese Application Serial No. 200880131514.3, Office Action dated Feb. 24, 2014", 10 pgs.
(Continued)

*Primary Examiner* — Esaw T Abraham
(74) *Attorney, Agent, or Firm* — Schwegman Lundberg & Woessner, P.A.

(57) ABSTRACT

Various embodiments disclose a controller to manage memory devices. In an exemplary method, signals are exchanged with a host processor to allow the host processor to communicate with multiple memory devices in a memory stack as a single device, regardless of an actual number of memory devices within the memory stack. Power is provided to a single one of the multiple memory devices in the memory stack at a time to reduce power consumption. Other methods, apparatuses, and devices are also disclosed.

20 Claims, 3 Drawing Sheets

Related U.S. Application Data continuation of application No. 14/456,559, filed on Aug. 11, 2014, now Pat. No. 9,213,603, which is a continuation of application No. 13/122,909, filed as application No. PCT/IB2008/002658 on Oct. 9, 2008, now Pat. No. 8,806,293.

(51) Int. Cl.
    *G06F 11/10*         (2006.01)
    *G06F 13/16*         (2006.01)
    *G06F 1/32*          (2006.01)
    *G06F 12/02*         (2006.01)
    *G11C 29/52*         (2006.01)

(52) U.S. Cl.
    CPC .......... *G06F 3/0659* (2013.01); *G06F 3/0679* (2013.01); *G06F 11/10* (2013.01); *G06F 11/1044* (2013.01); *G06F 11/1068* (2013.01); *G06F 11/1072* (2013.01); *G06F 12/0246* (2013.01); *G06F 13/1668* (2013.01); *G11C 29/52* (2013.01); *Y02B 60/1228* (2013.01)

(56) References Cited

U.S. PATENT DOCUMENTS

| | | | |
|---|---|---|---|
| 6,414,895 B2 | 7/2002 | Kokubo et al. | |
| 7,302,534 B2 | 11/2007 | Sinclair | |
| 7,310,699 B2 | 12/2007 | Sinclair | |
| 7,350,044 B2 | 3/2008 | Keays | |
| 7,433,712 B2 * | 10/2008 | Moran | G06Q 50/24 455/556.1 |
| 7,450,441 B2 | 11/2008 | Lee | |
| 7,457,897 B1 * | 11/2008 | Lee | G06F 13/1684 710/10 |
| 7,483,329 B2 | 1/2009 | Luo et al. | |
| 7,552,311 B2 * | 6/2009 | Hara | G06F 12/0862 711/103 |
| 7,693,548 B2 * | 4/2010 | Moran | G06Q 50/24 455/556.1 |
| 7,702,831 B2 * | 4/2010 | Ma | G06F 12/0246 710/52 |
| 7,821,851 B2 | 10/2010 | Kim | |
| 7,974,143 B2 | 7/2011 | Lee | |
| 8,041,844 B2 * | 10/2011 | Hunsaker | G06F 13/4295 370/292 |
| 8,069,380 B2 * | 11/2011 | Murin | G11C 29/1201 714/718 |
| 8,108,590 B2 * | 1/2012 | Chow | G06F 12/0246 711/103 |
| 8,131,912 B2 | 3/2012 | Ozawa et al. | |
| 8,151,163 B2 | 4/2012 | Shalvi et al. | |
| 8,180,931 B2 * | 5/2012 | Lee | G06F 3/0613 710/14 |
| 8,237,200 B2 | 8/2012 | Yoon | |
| 8,291,295 B2 | 10/2012 | Harari et al. | |
| 8,806,293 B2 | 8/2014 | Tiziani et al. | |
| 8,990,475 B2 * | 3/2015 | Meir | G06F 3/0611 711/103 |
| 9,213,603 B2 | 12/2015 | Tiziani et al. | |
| 9,569,129 B2 | 2/2017 | Tiziani et al. | |
| 2003/0156454 A1 | 8/2003 | Wei et al. | |
| 2007/0074093 A1 | 3/2007 | Lasser | |
| 2007/0165457 A1 | 7/2007 | Kim | |
| 2008/0046630 A1 | 2/2008 | Lasser | |
| 2008/0065937 A1 | 3/2008 | Micheloni et al. | |
| 2008/0163023 A1 | 7/2008 | Hong et al. | |
| 2011/0307762 A1 | 12/2011 | Tiziani et al. | |
| 2014/0351675 A1 | 11/2014 | Tiziani et al. | |
| 2016/0098223 A1 | 4/2016 | Tiziani et al. | |

FOREIGN PATENT DOCUMENTS

| | | |
|---|---|---|
| JP | 2003242470 A | 8/2003 |
| JP | 2003015947 A | 8/2004 |
| JP | 2007161748 A | 6/2007 |
| JP | 2008090433 A | 4/2008 |
| JP | 2008102693 A | 5/2008 |
| JP | 2008040723 A | 8/2008 |
| JP | 2009003994 A | 1/2009 |
| TW | 200839502 A | 10/1997 |
| TW | I267862 B | 12/2006 |
| TW | 200712863 A | 4/2007 |
| TW | I285378 B | 8/2007 |

OTHER PUBLICATIONS

"Chinese Application Serial No. 200880131514.3, Office Action dated Apr. 17, 2013", 17 pgs.
"Chinese Application Serial No. 200880131514.3, Office Action dated Sep. 5, 2014", w/English Translation, 10 pgs.
"Chinese Application Serial No. 200880131514.3, Office Action dated Sep. 24, 2015", 15 pgs.
"Chinese Application Serial No. 200880131514.3, Response filed May 9, 2014 to Office Action dated Feb. 24, 2014", w/English Claims, 8 pgs.
"Chinese Application Serial No. 200880131514.3, Response filed Oct. 29, 2013 to Office Action dated Apr. 17, 2013", 12 pgs.
"Chinese Application Serial No. 200880131514.3, Response filed Nov. 18, 2014 to Office Action dated Sep. 5, 2014", w/English Claims, 14 pgs.
"International Application Serial No. PCT/IB2008/002658, International Preliminary Report on Patentability dated Apr. 12, 2011", 7 pgs.
"International Application Serial No. PCT/IB2008/002658, International Search Report and Written Opinion mailed", 9 pgs.
"Japanese Application Serial No. 2011-530580, Examiners Decision of Final Refusal dated Apr. 1, 2014", w/English Translation, 6 pgs.
"Japanese Application Serial No. 2011-530580, Office Action dated May 28, 2013", 11 pgs.
"Japanese Application Serial No. 2011-530580, Response filed Oct. 17, 2013 to Office Action dated May 28, 2013", 17 pgs.
"Japanese Application Serial No. 2014-158171, Amendment filed Oct. 28, 2014", w/English Claims, 5 pgs.
"Japanese Application Serial No. 2014-158171, Office Action Received Sep. 1, 2015".
"Taiwanese Application Serial No. 097139047, Office Action dated Jun. 30, 2014", w/English Translation, 7 pgs.
"Taiwanese Application Serial No. 097139047, Response filed Sep. 30, 2014", w/English Translation, 15 pgs.
"Chinese Application Serial No. 200880131514.3 Response filed Jun. 4, 2015 to Office Action dated Apr. 23, 2015", With the English claims, 13 pgs.
"Chinese Application Serial No. 200880131514.3, Office Action dated Mar. 20, 2015", w/English Translation, 11 pgs.
"Eureka Technology: EP501NAND Flash Controller", w/English Translation, [researched on Nov. 18, 2016] Aug. 15, 2008. In the internet: <URL:https://web.archive.org/web/*/http://www.eurekatech.com/partners/lattice/ep501ps.pdf>, 9 pgs.
"German Application Serial No. 112008004033.8, Office Action dated Nov. 21, 2016", w/English Translation, 3 pgs.
"German Application Serial No. 112008004033.8, Response filed Mar. 24, 2017 to Office Action dated Nov. 21, 2016", w/English Claims, 18 pgs.
"Japanese Application Serial No. 2014-158171, Response filed Nov. 4, 2015 to Office Action Received Sep. 1, 2015", w/English Claims, 9 pgs.

* cited by examiner

CONTROLLER TO MANAGE NAND MEMORIES

This application is a continuation patent application of U.S. application Ser. No. 14/967,934, filed Dec. 14, 2015 now issued as U.S. Pat. No. 9,569,129; which is a continuation patent application of Ser. No. 14/456,559, filed Aug. 11, 2014, now issued as U.S. Pat. No. 9,213,603; which is a continuation patent application of U.S. application Ser. No. 13/122,909, filed Sep. 1, 2011, now issued as U.S. Pat. No. 8,806,293; which is a U.S. National Stage Application under 35 U.S.C. § 371 from International Application Serial No. PCT/IB2008/002658, filed Oct. 9, 2008, published as WO/2010/041093; each of which is incorporated herein by reference in its entirety.

Today's communication devices continue to become more sophisticated and diverse in providing increasing functionality. These devices support multimedia that requires higher capacity memory, particularly that afforded by multiple chip package designs. Communications links, busses, chip-to-chip interconnects and storage media may operate with high levels of intrinsic signal/storage failures. These communication devices are expected to incorporate error detection and correction mechanisms. ECC (Error Correcting Codes) has moved into memory storage structures but additional improvements are needed.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
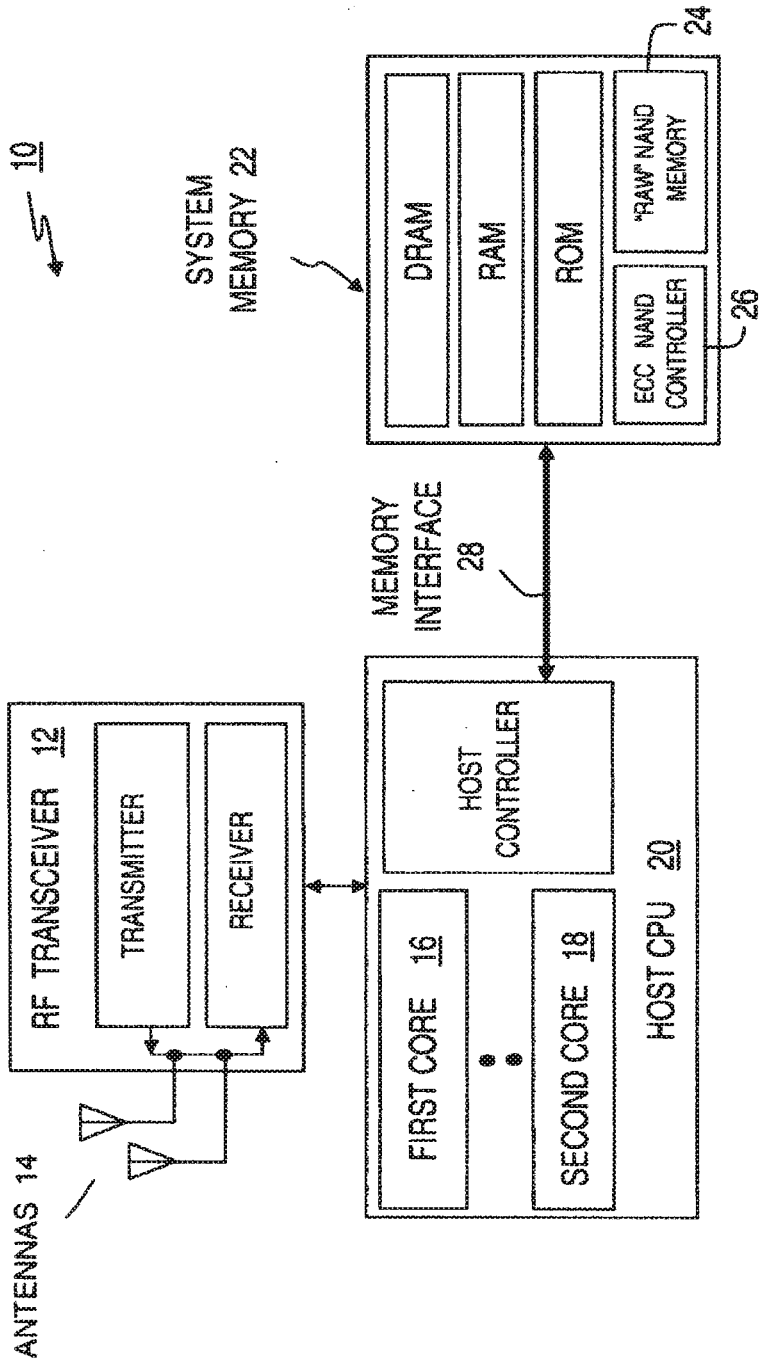
FIG. 1 illustrates a wireless architecture that incorporates a virtualized ECC NAND controller to execute the ECC algorithm and manage data transfers between a host processor and a stack of NAND memory in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

The embodiment illustrated in FIG. 1 shows a communications device 10 that may include nonvolatile memory with a virtualized ECC NAND controller servicing multiple NAND flash devices in accordance with the present invention. The present invention is not limited to wireless communication embodiments and other, non-wireless applications may use the present invention. As shown in this wireless embodiment, communications device 10 includes one or more antenna structures 14 to allow radios to communicate with other over-the-air communication devices. As such, communications device 10 may operate as a cellular device or a device that operates in wireless networks such as, for example, Wireless Fidelity (Wi-Fi), WiMax, Mobile WiMax, Wideband Code Division Multiple Access (WCDMA), and Global System for Mobile Communications (GSM) networks, although the present invention is not limited to operate in only these networks. The radio subsystems collocated in the same platform of communications device 10 provide the capability of communicating with different frequency bands in an RF/location space with other devices in a network.

The embodiment illustrates the coupling of antenna structure 14 to a transceiver 12 to accommodate modulation/demodulation. In general, analog front end transceiver 12 may be a stand-alone Radio Frequency (RF) discrete or integrated analog circuit, or transceiver 12 may be embedded with a host Central Processing Unit (CPU) 20 having one or more processor cores 16 and 18. The multiple cores allow processing workloads to be shared across the cores and handle baseband functions and application functions. Data and instructions may transfer between the CPU and memory storage through a memory interface 28.

System memory 22 may include both volatile memory and nonvolatile memory such as, for example, NAND memory structures 24. Note that the volatile and nonvolatile memories may be packaged separately, or alternatively, be combined in a stacking process. In particular, the multiple NAND memory structures may be placed in a Multi-Chip Package (MCP) to reduce the footprint on a board. Thus, the various embodiments of system memory 22 show that memory devices may be arranged in different ways by mixing memory devices and configurations to utilize the limited space within communication products, and various package options may be used to find the right combination of low power and high reliability.

In prior art, an ECC (Error Correcting Code) algorithm performed internally to a NAND memory is restricted to provide error detection and correction mechanisms that are applicable to only that single memory device. It is costly to update a fixed host platform to support a new NAND technology in terms of ECC needs, page size, address capability, new command set specification, etc. Further restricting, the ECC algorithm is technology specific. For example, a change between Single Level Cell (SLC) technology and Multi Level Cell (MLC) technology would invalidate the ECC algorithm in-use. Additionally, a replacement memory having a different product shrink level would necessitate a modification to the existing ECC algorithm. And, present memory devices having internally incorporated ECC impose a cost penalty based on the combined die area for the flash and the ECC algorithm logic.

Figure 2:
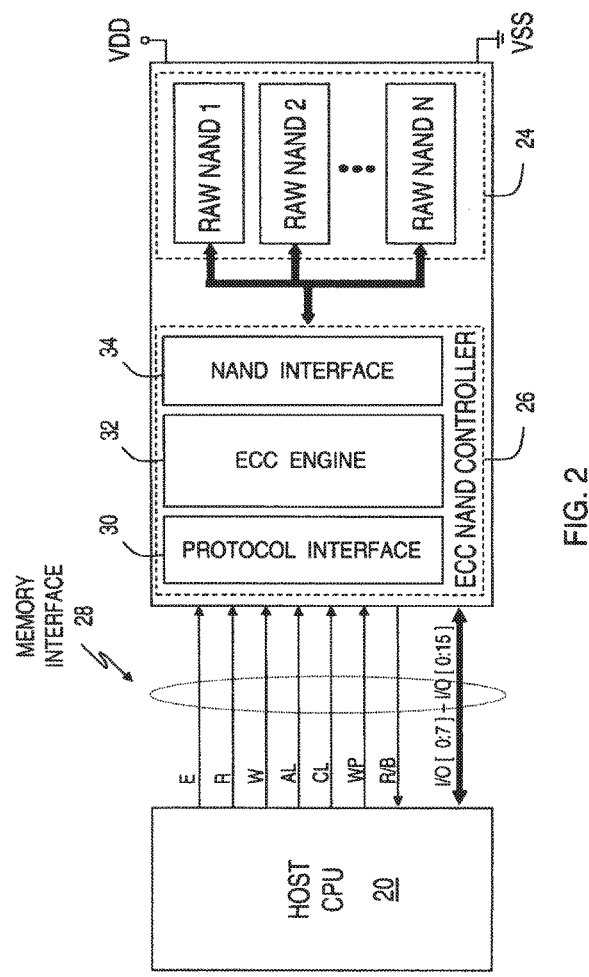
FIG. 2 illustrates the host processor to memory interface with the virtualized ECC NAND controller providing functional blocks that both execute the ECC algorithm and manage the data transfers to the stack of NAND memory.

To overcome these deficiencies and in accordance with the present invention, the architecture illustrated in FIG. 2 allows a single virtualized ECC NAND controller 26 to service multiple NAND memory structures, i.e., a "raw" memory stack 24. The term "raw" implies that the NAND memory devices do not internally implement an ECC algorithm. Host CPU 20 drives the virtualized ECC NAND controller 26 and the raw NAND memory structures as a single memory system regardless the number of raw NAND memories inside it. Moreover, the power consumption is reduced compared with the prior art stacked architecture because this solution can select one NAND a time. Virtualized ECC NAND controller 26 includes a protocol interface 30 that exchanges signals with host CPU 20; an ECC engine 32 that serves to implement the ECC algorithm; and a NAND interface 34 that manages memory stack 24.

Virtualized ECC NAND controller 26 functions as the bridge from the host NAND interface to the raw NAND memory stack and provides the right ECC algorithm to the host for the raw NAND provided in the system memory. The host side operates with its standard NAND interface, address space, command set, page size, ECC, etc., and virtualized ECC NAND controller 26 adapts the host side to the specific raw NAND that is incorporated into the memory stack.

By removing the ECC functionality from individual NAND memory devices in the NAND stack and incorporating that functionality in the ECC NAND controller 26, a variety of features may be realized. With ECC NAND controller 26 external to the NAND memory devices, the host side realizes a virtualized address space that permits the host to drive the system as a single NAND chip even though multiple NAND memory devices are in the storage system. Thus, host CPU 20 is free to manage more chips at the interface. In other words, with host CPU 20 managing one chip at the interface, virtualized ECC NAND controller 26 can manage the NAND memory devices in the stacked memory.

Prior art products implement ECC along with data management algorithms such as, for example, Flash Translation Layer (FTL), wear leveling, bad block management, etc. into a common integrated circuit. In contrast, the architecture presented in the figure separates ECC from the data management algorithms. Virtualized ECC NAND controller 26 implements only the ECC algorithm and not any other data management algorithm. This allows host CPU 20 to maintain full control of the virtualized memory in terms of data pages and the metadata area and virtualized ECC NAND controller 26 to provide a better ECC engine.

In utilizing virtualized ECC NAND controller 26 as the bridge from the host NAND interface to the raw NAND memory stack, the host platform can manage a page size that is different from the page size of the raw NAND. Further, virtualized ECC NAND controller 26 isolates the host platform from the memory stack, allowing host CPU 20 to use some commands that are not supported by the raw NAND. In one embodiment host CPU 20 may have a larger command set than the command set of the physical memory devices in the virtualized ECC NAND, while in another embodiment the command set of the host may be a reduced command set compared to the command set inside the Virtualized ECC NAND. In either embodiment, the logic within ECC NAND controller 26 adapts the command set of host CPU 20 to the command set of the physical memory devices. The host platform may use a basic NAND command set and the virtualized NAND controller 26 may use an extended new command set.

Figure 3:
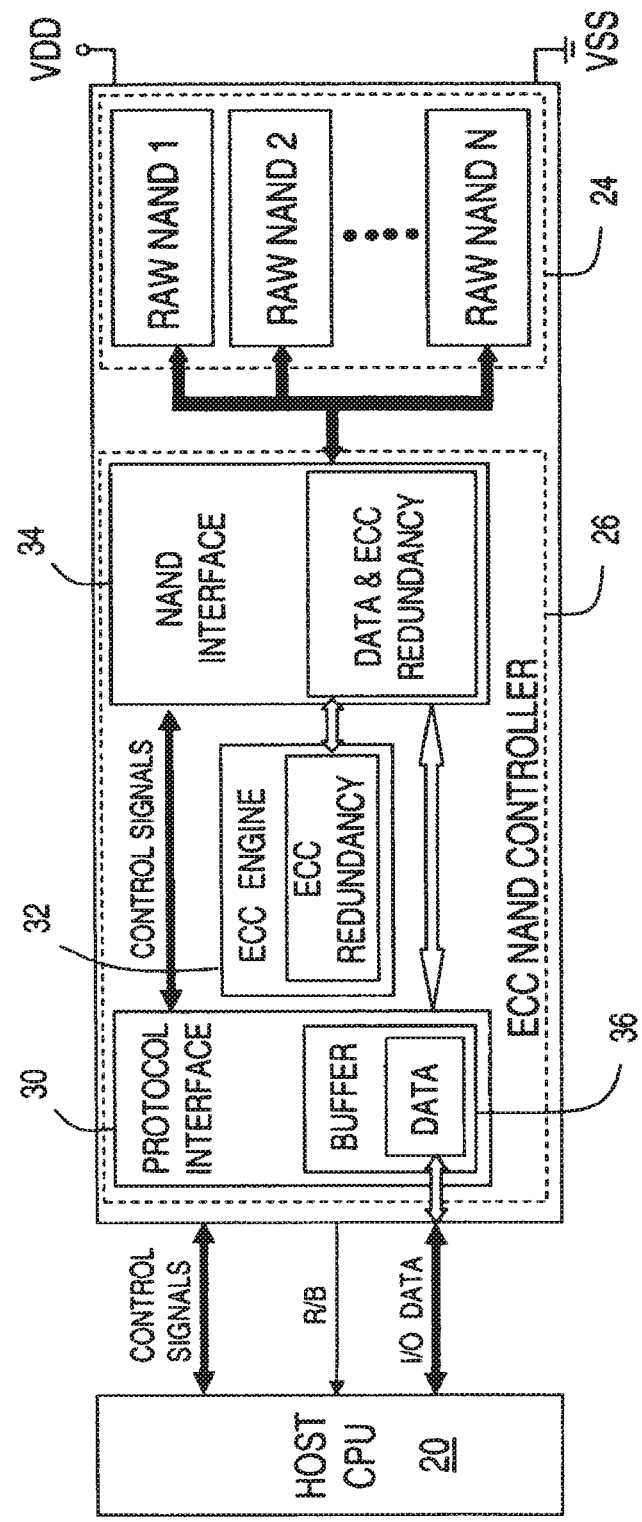
FIG. 3 shows further details of the virtualized ECC NAND controller.

FIG. 3 shows further details that allow host CPU 20 to interface to protocol interface 30 via electrical connections that are left unchanged from the protocol specification, allowing the host to communicate to a single memory system with a large error free address space. Put another way, this architecture allows host CPU 20 to provide data exchanges as a standard NAND interface with memory stack 24, keeping a virtual command set and address space.

Simultaneously and without adding internal logic to the host platform, ECC NAND 26 provides the ECC function to increase the overall reliability of data exchanges by correcting bit errors in the raw NAND. The addressing is virtualized because the host CPU 20 drives the connected memory device as if it was a single NAND chip, while the virtualized ECC NAND controller 26 redirects the data towards a selected NAND of the stack. Thus, a single virtualized ECC NAND controller 26 manages the stack of NAND flash memories and performs the ECC algorithm.

Further, this architecture with the virtualized ECC NAND controller 26 between the host CPU 20 and memory stack 24 makes it possible to adapt the use of a single NAND device to a host capable of managing a set of NAND memories using different Chip Enable (CE) pins. In one embodiment the host interface selectively drives different flash memories by the use of the CE signal while the virtualized ECC NAND is made up of a single NAND chip of higher densities. The internal logic of virtualized ECC NAND controller 26 translates the request from host CPU 20 which asserts one of the CE's into an operation which addresses a part of the NAND array, encoding the request in the address cycle which is supported by the selected NAND memory device itself. It should be noted that host CPU 20 may have a number of address cycles lower than the number of cycles required by a raw NAND memory device. Again, the host platform may manage a page size different from the page size of a raw NAND memory device and even use some commands not supported by the memory device such as, for example, a multi-plane operation or a cache operation.

For example, if the raw NAND memory device does not support the multi-plane operations, virtualized ECC NAND controller 26 can emulate these commands by two channels. If the raw NAND memory device does not support the cache operations, virtualized ECC NAND controller 26 can emulate the commands with an internal ping-pong buffer, etc. Furthermore, if the host platform needs a page size different from the page size of the raw NAND memory device, then virtualized ECC NAND controller 26 provides a virtualized physical block with a page size and a number of pages different from the real ones.

Protocol interface 30 is the portion of virtualized ECC NAND controller 26 that communicates with host CPU 20 using the standard NAND communication protocol. Protocol interface 30 interprets any received commands and further directs the storage of any data that the host transfers. Moreover, protocol interface 30 manages the NAND Ready/Busy signal in order to take into account the ECC algorithm latency. Protocol interface 30 includes an internal buffer 36 to store data transferred by host CPU 20 during a program operation. Following a confirm command protocol interface 30 sets the busy signal low in order to avoid any kind of data operation towards virtualized ECC NAND controller 26.

The size of buffer 36 is suitably chosen to reduce the latency introduced by the ECC calculation. With the proper buffer size the host CPU 20 may start to send a new page during a write operation without waiting for the previous flash program operation to end. This timing advantage is beneficial during a sequential read operation, and therefore, while ECC engine 32 calculates the redundancy on the current page, the next page can be retrieved from raw NAND.

ECC engine 32 is the portion of virtualized ECC NAND controller 26 that serves to implement the ECC algorithm that calculates the redundancy on data sent by host CPU 20.

The ECC algorithm is used to detect and correct errors that happen to the original information during storage, writing or reading to or from stacked memory 24. The ECC algorithm may implement multilevel, cyclic, error-correcting, variable-length digital codes to correct multiple random error patterns. As such, ECC engine 32 may implement a BCH code or a Reed-Solomon algorithm.

During a write operation, the ECC algorithm calculates the redundancy on data sent by host. The redundancy, once calculated, is added to the host data and transferred to the NAND flash page buffer. During a read operation, ECC engine 32 re-calculates the redundancy on the data coming from raw NANDs for comparing against the old redundancy value previously stored in the flash memory. If the two redundancies are equal, then the data is correct and allowed to transfer from the protocol interface buffer to the host CPU 20. However, if the two redundancies are not equal EGG engine 32 corrects the data bits in error before data may transfer to the host CPU 20. A read fail is signaled to host CPU 20 if the number of errors is higher than the EGG correction capability.

NAND interface 34 is the portion of virtualized ECC NAND controller 26 that serves to communicate with the raw NANDs by re-elaborating both the commands and the address previously received from the host CPU 20. Thus, in a write operation the data is transferred from the protocol interface buffer to the selected flash memory. In this function, NAND interface 34 decodes the address to redirect the received data to the selected NAND and sends the new payload of data plus EGG redundancy to the selected raw NAND in stacked memory 24. During this operation the busy signal remains low and transitions to a high signal level when the raw NAND program operation ends.

During a read operation, NAND interface 34 transfers data from the selected raw NAND to buffer 36 in protocol interface 30. In the meanwhile, ECC engine 32 processes the data to calculate the related parity for comparison with the redundancy read from the flash storage, and if necessary, bit corrections are performed.

When protocol interface 30 has one Chip Enable Pin and NAND interface 34 has more then one Chip Enable pin, the address is decoded in order to redirect the data towards the selected raw NAND memory device of the memory stack. On the other hand, when protocol interface 30 has more Chip Enable pins than NAND interface 34, the address is decoded in order to redirect the data to the right part of the raw NAND depending on which Chip Enable is low.

By using virtualized ECC NAND controller 26 to execute the ECC algorithm external to the stack of NAND flash memories, a flexible memory system solution is ensured as far as the technology and the number of memory devices. In fact, virtualized ECC NAND controller 26 may continue to operate irrespective of whether the non-volatile memory included in the memory stack 24 is SLC and/or MLC. Furthermore, virtualized ECC NAND controller 26 is capable of managing multiple flash NAND devices and even accommodates memory devices having different shrink levels. Also note that a change of ECC correction capabilities within virtualized ECC NAND controller 26 does not impact the flash NAND design. Moreover, power consumption is reduced compared with the traditional stacked architecture because the solution illustrated by the architecture shown in FIG. 3 can select one NAND memory device at a time.

As new memory technologies increase the number of bits stored in a single cell, the probability for reading, writing and retention errors increases. This necessitates the use of more complete ECC algorithms having codes with increased correction power. To resolve these technical difficulties, it should be apparent by now that the presented embodiments of the present invention provide an architecture in which a single controller manages a stack of NAND flash memories along with executing the ECC algorithm. This architectural allows the host CPU to drive a single memory system with a large error free address space using a standard NAND protocol By placing the ECC correction capability in the external controller, changes to the ECC algorithm may be facilitated without necessitating flash mask changes. The external controller also permits the use of different technologies for the controller and the NAND memories, and allows memory devices with different shrink levels.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A controller, comprising:
    a hardware-based protocol interface circuit to exchange signals with a host processor; and
    a memory interface to manage and to provide power selectively to multiple memory devices, the memory interface being configured to provide power to a select one of the multiple memory devices at a time to conserve an overall power consumption of a storage system.

2. The controller of claim 1, wherein at least some of the multiple memory devices are raw NAND memory devices that do not internally implement an Error Correcting Code (ECC) algorithm.

3. The controller of claim 2, wherein the controller is further configured to:
    interpret page size commands received from the host processor to function with page sizes within the raw NAND memory devices; and
    adapt a command set of the host processor to function with a reduced command set of the raw NAND memory devices.

4. The controller of claim 2, wherein the controller adapts commands issued by the host processor that are not supported by the raw NAND memory devices.

5. The controller of claim 2, wherein the controller is to present a single NAND interface to the host processor that removes a restriction on a number of usable flashes in each of the raw NAND memory devices due to available address input cycles.

6. The controller of claim 1, wherein the controller is to implement an Error Correcting Code (ECC) algorithm for each of the multiple memory devices.

7. The controller of claim 6, wherein the hardware-based protocol interface circuit includes a buffer to reduce latency introduced by calculations of the ECC algorithm.

8. The controller of claim 1, wherein and the controller does not include data management algorithms of wear leveling and bad block management.

9. The controller of claim 1, wherein the controller is a non-volatile memory device that is configured to redirect data received from the host processor to a selected one or more of the multiple memory devices.

10. The controller of claim 1, wherein the controller adapts commands issued by the host processor that are not supported by the multiple memory devices.

11. The controller of claim 1, wherein the multiple memory devices include both volatile memory devices and non-volatile memory devices.

12. A controller to interface with multiple NAND memory devices in a storage system, the controller comprising:
   a hardware-based protocol interface device to exchange signals with a host processor and to direct the storage of data received from the host processor; and
   a NAND interface to manage the multiple NAND memory devices and configured to provide power to a select one of the plurality of NAND memory devices at a time to conserve overall power consumption of the storage system.

13. The controller of claim 12, wherein the controller further comprises an Error Correcting Code (ECC) engine to implement an ECC algorithm.

14. The controller of claim 12, wherein the controller is further configured to emulate commands issued by the host processor that are not supported by the multiple NAND memory devices.

15. The controller of claim 1, wherein the storage system further comprises a radio subsystem configured to communicate with different frequency bands with other devices in a network.

16. A method, comprising:
   exchanging signals between a hardware-based protocol interface device and a host processor to allow the host processor to communicate with a multiple memory devices in a memory stack as a single device; and
   providing power, from a memory interface device, to a single one of the multiple memory devices in the memory stack at a time to reduce power consumption.

17. The method of claim 16, further comprising the hardware-based interface device adapting signals from and to the host processor to at least a specific one of the multiple memory devices.

18. The method of claim 16, wherein the multiple memory devices do not internally implement an Error Correcting Code (ECC) algorithm, and further comprising implementing a single virtualized FCC algorithm by an FCC engine block external to the multiple memory devices.

19. The method of claim 18, further comprising:
   interpreting commands received from the host processor by the hardware-based protocol interface device to direct the storage of data received from the host processor; and
   loading a buffer in the hardware-based protocol interface device having buffering capabilities to read a second page of data for parallelizing ECC algorithm execution in a sequential read operation.

20. The method of claim 16, further comprising re-elaborating both commands and addresses received from the host processor by the hardware-based protocol interface device to manage data transfers to the multiple memory devices.

* * * * *